United States Patent [19]

Phoy et al.

[11] Patent Number: 5,455,742
[45] Date of Patent: Oct. 3, 1995

[54] DIRECT CIRCUIT BOARD CONNECTION

[75] Inventors: Chamroeun P. Phoy, Glendale Heights; Richard L. Lauritsen, Hoffmann Estates; M. Douglas Boyd, Hanover Park, all of Ill.

[73] Assignee: Eaton Corporation, Cleveland, Ohio

[21] Appl. No.: 215,337

[22] Filed: Mar. 21, 1994

[51] Int. Cl.$^6$ ..................................... H05K 1/18
[52] U.S. Cl. .................. 361/778; 361/784; 361/788; 361/802; 361/810; 174/250; 174/263; 439/68; 439/74
[58] Field of Search .................................. 361/748, 752, 361/778, 784, 788, 790, 792, 796, 802, 803, 810; 174/52.1, 52.4, 250, 255, 261, 263; 439/74, 68, 76

[56] References Cited

U.S. PATENT DOCUMENTS 3,624,587  2/1970  Conrad ................. 339/17 M

Primary Examiner—Leo P. Picard
Assistant Examiner—Young Whang
Attorney, Agent, or Firm—Roger A. Johnston

[57] ABSTRACT

A direct connection for printed circuit boards where a primary board has a slot therethrough with slight edge projections which control the width of the slot to close tolerances. Spaced parallel conductive strips on the surfaces of the primary board terminate at the slot. A secondary board has an insert portion sized and configured for insertion into the slot in a close fit with the edge projections to maintain the boards mutually perpendicular. Spaced parallel strips on the insert are disposed adjacent the termination of the primary board strip. The strips are interconnected by soldering to provide direct circuit interconnection between the primary and secondary boards.

9 Claims, 1 Drawing Sheet

DIRECT CIRCUIT BOARD CONNECTION

BACKGROUND OF THE INVENTION

The present invention relates to electrical interconnection between separate circuit boards and particularly relates to making electrical interconnection between circuit boards of a type having the circuitry etched on a metal foil laminated on an insulating substrate or printed circuit boards as they are commonly called. Heretofore, it has been the practice in mass production of electronic devices to interconnect individual circuit boards by a flexible connector such as a multiple conductor ribbon which has the opposite ends of its conductors attached to separate circuit boards which may then be stacked by bending of the flexible ribbon with the interconnection remaining intact. However, in electronic devices where the volume of the assembled device must be maintained at a minimum, it is often cumbersome and prohibitive from a volume standpoint to stack individual circuit boards with the flexible ribbon connector extending from the sides of the stacked boards.

In addition where a flexible multiconductor ribbon connector is employed to interconnect separate circuit boards, it has been found difficult to handle the boards after connection of the ends of the connector to the individual boards, particularly where the conductors are soldered during assembly operations without breaking the soldered connections of the conductor ends and particularly during the flexing of the ribbon. In addition, the cost of the multiple conductor ribbon and the individual soldering of the ends of the conductors has proven to be time consuming and costly in mass production.

Accordingly, it has long been desired to provide a simple reliable and low cost technique or way for directly interconnecting individual circuit boards and particularly printed circuit boards in a manner which readily lends itself to mass production and provides an electrical connection of sufficient integrity to prove viable during the service life of the electronic device.

SUMMARY OF THE INVENTION

The present invention provides a way or technique for directly interconnecting individual printed circuit boards in a manner which provides physical support for the interconnection with the boards extending mutually at right angles and also provides for direct electrical interconnection of the circuit strips on the individual printed circuit boards. The primary circuit board has an elongated slot formed therein with lug portions of the substrate material extending from the sides of the slot to a closely controlled distance oppositely spaced from each other to provide tolerance control of the width of the slot. The secondary printed circuit board has an insert portion thereof formed to a size and configuration to interfit the slot with the thickness of the secondary board corresponding to the width of the slot for insertion therethrough. The primary board has a plurality of exposed conductive strips formed on the surface thereof in spaced parallel relationship and terminating at the edge of the slot. The secondary board has a correspondingly disposed plurality of spaced parallel conductive strips formed thereon. Assembly insertion of the insert portion of the secondary board into the slot on the primary board is accomplished in closely fitting relationship with the long portions of the slot giving mechanical positioning support to the assembly. The adjacent ends of the conductive strips on the individual boards are then electrically interconnected by soldering, preferably by wave soldering, which bridges the slight gap therebetween. The present circuit board connection permits direct plug-in of a secondary board into a slot in a primary board and with the assembly thereof wave soldered for electrical interconnection and thus provides a simple economical and reliable way of connecting individual circuit boards in mass production without the need for external electrical conductors.

DETAILED DESCRIPTION

Figure 1:
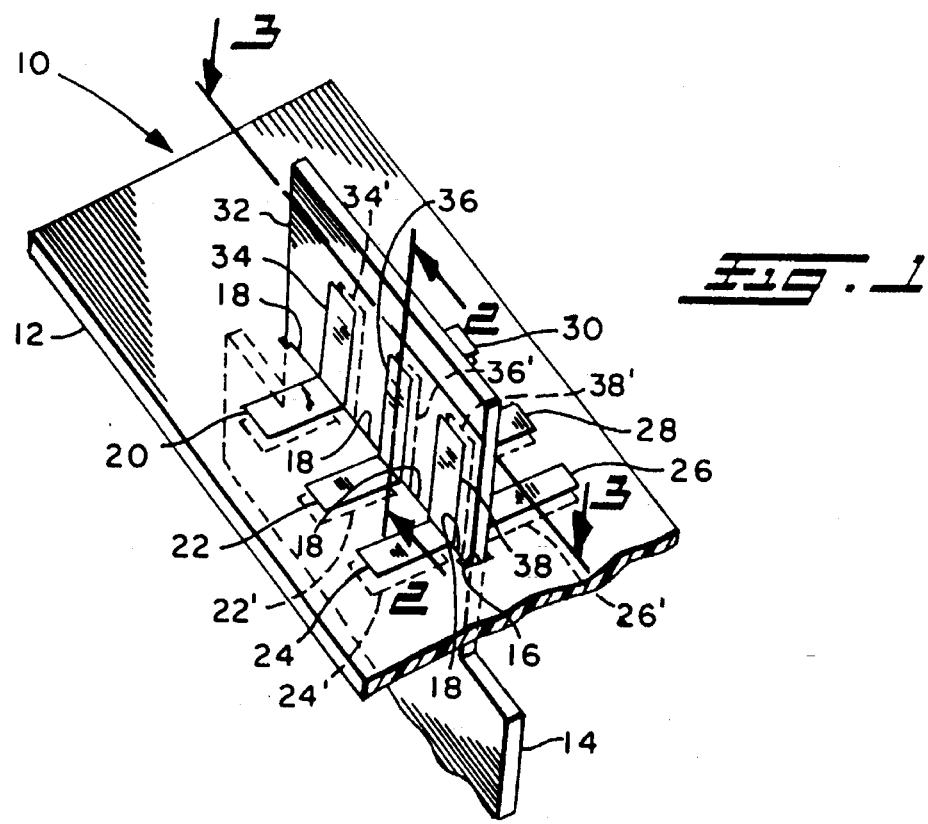
FIG. 1 is an axonometric view of the assembled circuit boards of the secondary circuit board inserted into the slot of the primary circuit board.
Figure 2:
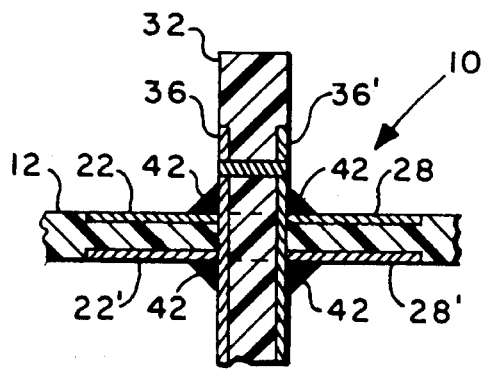
FIG. 2 is a portion of a section view taken along section indicating lines 2—2 of FIG. 1; and, FIG. 3 is a portion of a section view taken along section indicating lines 3—3 of FIG. 1.
Figure 3:
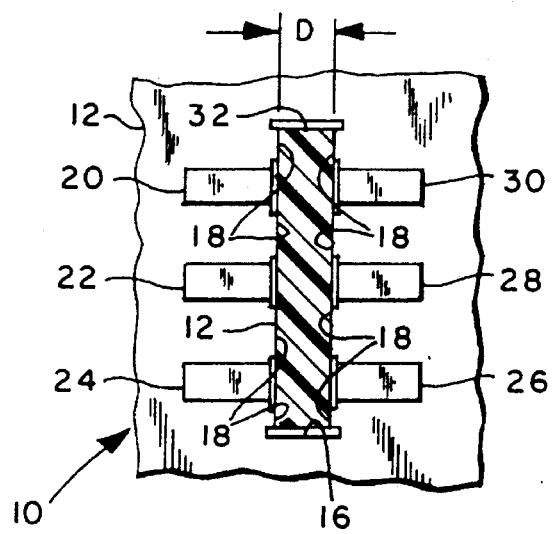

Referring to FIGS. 1 through 3, the assembly of the present invention is indicated generally at 10 and includes a primary circuit board 12, typically a printed circuit board, which has an elongated slot 16 formed therein. The printed circuit board 12 is of the type having a substrate of insulating material formed with conductive film thereon portions thereof masked and etched away to form a desired circuit configuration (not shown). Although not illustrated, it will be understood that discrete components may be secured to the board 12 and any circuit thereon.

The opposite elongated sides of the slot 16 have extending therefrom a plurality of space projections of the substrate material denoted by reference numeral 18. The ends of the projections 18 on opposite sides of the slot 16 terminate at a closely controlled distance from each other so as to define a slot having tightly controlled tolerances on the width of thereof. This distance is denoted by the reference character "D" in FIG. 3.

The circuit board 12 has a plurality of spaced generally parallel conductive strips, denoted by reference numerals 20,22,24 in the drawings, provided on one side of the slot 16. A second plurality of spaced generally parallel strips denoted by reference numerals 26,28,30 extends on the opposite side of the slot 16 which strips are formed on the surface of the printed circuit board 12 with their ends terminating at the edges of the slot 16 intermediate the projections 18.

As shown in FIG. 2, if desired each of the strips such as strips 20,22,24,26,28,30 on the upper surface of the primary board 12 may have a counterpart strip located directly below on the undersurface of the board as denoted by reference numerals 20',22',24',26',28',30' in FIGS. 1 and 2. It will be understood however, that the counterpart strips 20',22',24', 26',28',30' are not necessary for the practice of the invention.

The secondary board 14 likewise has a plurality of conductive strips disposed thereon in spaced generally parallel relationship on the insert portion of the board which is denoted by reference numeral 32 and which strips are denoted by reference numerals 34,36,38 on the front side of the board portion 32. Preferably counterpart strips denoted with corresponding primed numerals are provided on the opposite face thereof.

Referring to FIG. 2, the strips on the portion 32 of member 14 are disposed oppositely in pairs at a common station thereon such as the pair 36, 36' and are interconnected through a hole or "via" aperture 40 formed through the insulating substrate material which permits the metal conductor when plated on the board 14 to be deposited in the "via" aperture and interconnect the strips 36, 36'. It will be understood that in similar fashion strips 34 and its oppositely disposed strip 34' which is shown only in dashed outline are interconnected, as are strip 38 and its oppositely disposed strip 38' which is shown only in dashed outline.

Upon insertion of the portion 32 of secondary board 14 into the slot 16, the lug portions 18 position and maintain the boards 12, 14 in mutually perpendicular arrangement. The strips on the primary board are then interconnected with the strips respectively disposed adjacent thereto by soldering as denoted by reference numeral 42, preferably by wave soldering, which bridges the gaps therebetween and makes electrical contact with the strips on the secondary board. FIG. 2 illustrates typically the electrical connection between strip 36 and the strips 22, 22' and the electrical connection between strip 36' and the strips 28, 28'. It will be understood that strips 20',22',24' and 26',28',30' may be omitted and are not essential for the practice of the invention.

The present invention thus provides for direct plug-in connection of individual circuit boards by insertion of a portion of one sized and configured to closely interfit a slot in the other board with strips provided on each board terminating closely spaced and adjacent and which are subsequently electrically interconnected by soldering.

Although the invention has been described hereinabove with respect to the illustrated embodiments, it will be understood that the invention is capable of modification and variation and is limited only by the following claims.

We claim:

1. A circuit board assembly comprising:
   (a) a primary circuit board of insulating material with at least one first conductive strip thereon and having an elongated slot formed therethrough, said slot having at least one projecting portion thereof extending into said slot from the sides thereof with said at least one first strip terminating adjacent the sides and edges of said slot;
   (b) a secondary circuit board formed of insulating material with at least one second conductive strip thereon and having an insert portion thereof sized and configured to interfit said slot, said insert portion received in said slot and closely interfitting said at least one projection, wherein said at least one second strip is disposed adjacent the said terminating of said at least one first strip; and,
   (c) weldment securing said at least one first strip and said at least one second strip in electrical connection, wherein said secondary board insert portion is received in said elongated slot on one side of said primary board and extends through said slot beyond the surface of the side of said primary board opposite said one side.

2. The assembly defined in claim 1, wherein said at least one first conductive strip includes a plurality of spaced generally parallel strips; and, said at least one second conductive strip includes a plurality of spaced generally parallel strips.

3. The assembly defined in claim 1, wherein said weldment comprises soldering.

4. The assembly defined in claim 1, wherein said plural projecting portions are disposed opposite sides of said slot.

5. The assembly defined in claim 1, wherein said secondary board has at least one via aperture therethrough with said at least one strip including a pair of strips disposed on opposite sides of said secondary board and interconnected through said via aperture.

6. The method of electrically interconnecting two individual circuit boards comprising:
   (a) providing a first circuit board with conductive strips thereon and forming a slot therein and terminating the edges of the strips adjacent the edge of the slot;
   (b) providing a second circuit board with conductive strips and forming a connecting portion thereon and inserting said connecting portion in said slot; and,
   (c) connecting electrically said at least one first strip to said at least one second strip.

7. The method defined in claim 6, wherein said connecting electrically comprises soldering.

8. The method defined in claim 6 further comprising forming by portions on the sides of said slot and maintaining said first and second boards in mutually perpendicular arrangement.

9. The method defined in claim 6, wherein said connecting comprises wave soldering.

* * * * *